United States Patent [19]
Wheatley, III

[11] Patent Number: 5,732,341
[45] Date of Patent: Mar. 24, 1998

[54] METHOD AND APPARATUS FOR INCREASING RECEIVER IMMUNITY TO INTERFERENCE

[75] Inventor: Charles E. Wheatley, III, Del Mar, Calif.

[73] Assignee: QUALCOMM Incorporated, San Diego, Calif.

[21] Appl. No.: 522,467

[22] Filed: Aug. 31, 1995

Related U.S. Application Data

[63] Continuation-in-part of Ser. No. 357,951, Dec. 16, 1994, Pat. No. 5,722,063.

[51] Int. Cl.$^6$ ................ H04B 1/10; H04G 3/20
[52] U.S. Cl. ................ 455/234.1; 455/219; 455/232.1
[58] Field of Search ................ 455/13.4, 63, 67.1, 455/219, 226.1, 226.2, 232.1, 240.1, 234.1, 245.1, 245.2, 250.1, 254, 268

[56] References Cited

U.S. PATENT DOCUMENTS

| | | | |
|---|---|---|---|
| 4,817,198 | 3/1989 | Rinderle | 455/245.1 |
| 4,989,074 | 1/1991 | Matsumoto | 455/240.1 |
| 5,036,527 | 7/1991 | Halim et al. | 455/245.1 |
| 5,093,840 | 3/1992 | Schilling | 375/1 |
| 5,119,508 | 6/1992 | Shamaundara | 455/234.1 |
| 5,134,707 | 7/1992 | Sakashita et al. | 455/234.1 |
| 5,179,353 | 1/1993 | Miyake | 455/116 |
| 5,184,349 | 2/1993 | Riordan | 455/250.1 |
| 5,276,685 | 1/1994 | Kepler et al. | 455/234.1 |
| 5,321,847 | 6/1994 | Johnson, Jr. | 455/63 |
| 5,321,851 | 6/1994 | Sugayama et al. | 455/161.3 |
| 5,331,638 | 7/1994 | Honkasalo et al. | 455/245.1 |
| 5,339,453 | 8/1994 | Sugayama et al. | 455/245.2 |
| 5,369,792 | 11/1994 | Matsumoto et al. | 455/245.1 |
| 5,408,698 | 4/1995 | Serizawa et al. | 455/245.1 |
| 5,448,774 | 9/1995 | Yobazaki et al. | 455/234.1 |
| 5,493,713 | 2/1996 | Horsfall et al. | 455/234.1 |
| 5,509,030 | 4/1996 | Mortensen | 375/232 |
| 5,555,277 | 9/1996 | Lawrence et al. | 375/346 |
| 5,564,092 | 10/1996 | Grandfield et al. | 455/250.1 |
| 5,564,094 | 10/1996 | Anderson et al. | 455/295 |

FOREIGN PATENT DOCUMENTS

| | | | |
|---|---|---|---|
| 0342671 | 11/1989 | European Pat. Off. | H03G 3/20 |
| 9107037 | 5/1991 | European Pat. Off. | H04L 27/30 |
| 0622907 | 11/1994 | European Pat. Off. | H03B 1/38 |

*Primary Examiner*—Leslie Pascal
*Attorney, Agent, or Firm*—Russell B. Miller; Roger W. Martin

[57] ABSTRACT

The process of the present invention adjusts the input gain by a predetermined amount. The receiver processing measures the gain change in the IF sisal power. If the change is less than the predetermined amount, the CDMA signal and jammers are below the noise floor and, therefore, the gain is increased. If the IF signal power change is equal to the predetermined amount, the CDMA signal is above the noise floor and the interference is minimal. Therefore, in this case, gain adjustment is not necessary, but increasing gain will improve sensitivity. If the IF signal power change is greater than the predetermined amount, the interference is evident and the gain is reduced to reduce the intermodulation products. This process is used until the receiver is operating at the best compromise between interference and noise figure.

20 Claims, 14 Drawing Sheets

METHOD AND APPARATUS FOR INCREASING RECEIVER IMMUNITY TO INTERFERENCE

This application is a CIP of U.S. application Ser. No. 08/357,951 filed Dec. 16, 1994 which is now U.S. Pat. No. 5,722,063.

BACKGROUND OF THE INVENTION

1. Field of the Invention

The present invention relates to radio communications. More particularly, the present invention relates to improving a communication receiver's immunity to interference.

2. Description of the Related Art

There are presently multiple types of cellular radiotelephone systems operating. These systems include the advanced mobile phone system (AMPS) and the two digital cellular systems: time division multiple access (TDMA) and code division multiple access (CDMA). The digital cellular systems are being implemented to handle capacity problems that AMPS is experiencing.

All the cellular radiotelephone systems operate by having multiple antennas covering a geographic area. The antennas radiate into an area referred to in the art as a cell. The AMPS cells are separate and distinct from the CDMA cells. This makes it likely that the antenna for one system's cell may be located in a cell of another system. Likewise, within a particular system (AMPS, CDMA, and TDMA), there are two service providers within a given area. These providers often choose to place cells in different geographical locations from their competitor, hence there are situations where a radiotelephone on system 'A' might be far away from the nearest system 'A' cell while close to a system 'B' cell. This situation means that the desired receive signal will be weak in the presence of strong multi-tone interference.

This intermixing of system antennas can cause problems for a mobile radiotelephone that is registered in one system, such as the CDMA system, and travels near another system's antenna, such as an AMPS antenna. In this case, the signals from the AMPS antenna can interfere with the CDMA signals being received by the radiotelephone due to the proximity of the radiotelephone with the AMPS cell or the higher power of the AMPS forward link signal.

The multi-tone interference encountered by the radiotelephone from the AMPS signals creates distortion products or spurs. If these spurs fall in the CDMA band used by the radiotelephone, they can degrade receiver and demodulator performance.

It is frequently the case in an AMPS system for the carriers (A and B bands) to 'jam' the competitor system unintentionally. The goal of the cellular carrier is to provide a high signal to noise ratio for all the users of their system by placing cells close to the ground, or near their users, and radiating the FCC power limit for each AMPS channel. Unfortunately, this technique provides for better signal quality for the carrier's system at the expense of interfering with the competitor's system.

Intermodulation distortion, such as that caused by the above situations, is defined in terms of the peak spurious level generated by two or more tones injected into a receiver. Most frequently, the third-order distortion level is defined for a receiver in terms of a third-order input intercept point or IIP3. IIP3 is defined as the input power (in the form of two tones) required to create third order distortion products equal to the input two tone power. As shown in FIG. 13, IIP3 can only be linearly extrapolated when a non-linear element, such as an amplifier, is below saturation.

As shown in FIG. 14, third-order distortion products occur when two tones are injected in a receiver. Tone #1 is at frequency f1 at power level P1 in dBm. Tone #2 is at frequency f2 at power level P2 in dBm. Typically P2 is set to equal P1. Third-order distortion products will be created at frequencies 2×f1 - f2 and 2×f2 - f1 at power levels P12 and P21 respectively. If P2 is set to equal P1, then spurious products should be equal, or P12 and P21 should be equal. Signal fc is injected at power level Pc to show that the added distortion is equal to a low level signal in this case. If there is a filter that filters out f1, f2 and f21 after the distortion is created, the power at f12 will still interfere with the signal power at fc. In example FIG. 14, for a CDMA application, the goal is that the intermod P12 should be equal to the signal power of −105 dBm for a total two tone power of −43 dBm, so the IIP3 must be >−9 dBm.

As is well known in the art, IIP3 for a single non-linear element is defined as the following:

$$IIP3 = \frac{IM3}{2} + P_{in} \text{ (dBm)}$$

If $P_1=P_2$, then $P_{in}=P_1+3$ dB or $P_2+3$ dB (dBm) and
$IM3=P_1-P_{12}=P_2-P_{21}=P_2-P_{12}=P_1-P_{21}$ (dB)

For cascaded IIP3, where more non-linear elements are used, the equation is as follows:

$$IIP3 = -10*\log10[10^{(Gain-element\ IIP3)/10} + 10^{(-IIP3\ of\ previous\ stages)/10}]$$

where:

Gain=gain to element input.

Therefore, one way to improve the cascaded IIP3 of a receiver is to lower the gain before the first non-linear element. In this case, the LNA and mixer limit IIP3. However, another quantity needs to be defined that sets the sensitivity or lowest receive signal level without interference. This quantity is referred to in the art as the noise figure (NF). If the gain of the receiver is reduced to improve IIP3 (and interference immunity), the NF (and sensitivity to small desired signals) is degraded.

The Element NF is defined as the following:

$$\text{Element } NF = \frac{S_i}{N_i} - \frac{S_0}{N_0} \text{ (dB)},$$

where:

Si/Ni is the input signal to noise ratio in dB, and
$S_o/N_o$ is the output signal to noise ratio in dB.

For elements in cascade in a receiver, the equation is as follows:

$$\text{Cascaded } NF = 10*\log10\left[10^{(NFi/10)} + \frac{10^{(NFe/10)} - 1}{10^{(Gain/10)}}\right],$$

where:

NFe equals the noise figure of the element,
NFi equals the cascaded noise figure up to the element, and
Gain equals the running gain up to the element.

The 'best' cascaded NF can be achieved if the gain up to the element is maximized, this equation is in contradiction to the requirement for the 'best' cascaded IIP3. For a given element by element and receiver NF and IIP3, there are a limited set of gain values for each element that meet all of the requirements.

Typically, a receiver is designed with NF and IIP3 as predefined constants, as both of these quantities set the receiver's dynamic range of operation with and without interference. The gain, NF, & IIP3 of each device are optimized based on size, cost, thermal, quiescent and active element current consumption. In the case of a dual-mode CDMA/FM portable cellular receiver, the CDMA standard requires a 9 dB NF at minimum signal. In other words, for CDMA mode, the sensitivity requirement is a 0 dB S/N ratio at −104 dBm. For FM mode, the requirement is a 4 dB S/N ratio at −116 dBm. In both cases, the requirements can be translated to a NF as follows:

$$NF = S(\text{dBm}) - \frac{S}{N} (\text{dB}) - N_{therm}(\text{dBm/Hz}) - \text{Signal } BW (\text{dB/Hz}),$$

where
S is the minimum signal power,
S/N is the minimum signal to noise ratio,
$N_{therm}$ is the thermal noise floor (−174 dBm/Hz@290° K.),
and Signal BW (dB/Hz) is the bandwidth of the signal.
Therefore, CDMA NF=−104 dBm−0 dB−(−174 dBm/Hz)−61 dB/Hz=9 dB, FM NF=−116 dBm−4 dB−(−174 dBm/Hz)−45 dB/Hz=9 dB, where
−61 dBm/Hz is the noise bandwidth for a CDMA channel
−45 dBm/Hz is the noise bandwidth for a FM channel However, the receiver's NF is only required when the signal is near the minimum level and the IIP3 is only required in the presence of interference or strong CDMA signals.

There are only two ways to provide coverage in the areas where the carrier is creating strong interference. One solution is to employ the same technique; i.e., co-locate their cells along with the competition's. Another solution is to improve the immunity of a receiver to interference. One way to improve the immunity is to increase the receiver current. This is not a practical solution, however, for a portable radio that relies on battery power. Increasing the current would drain the battery more rapidly, thereby decreasing the talk and standby time of the radiotelephone. There is a resulting need to minimize multi-tone interference in a radiotelephone without impacting the current consumption.

SUMMARY OF THE INVENTION

The process of the present invention adjusts attenuation in a circuit, thereby improving a receiver's immunity to interference. The circuit has an attenuator with attenuation and automatic gain control (AGC) with a variable gain. The process varies the attenuation by a predetermined amount. The gain of the circuit is then detected. If the detected gain change is greater than a predetermined threshold, intermodulation products have been detected and the front end attenuation is increased to reduce the intermodulation product power.

DESCRIPTION OF THE PREFERRED EMBODIMENT

It is an objective of the present invention to vary the receiver NF and IIP3 for enhancing the IIP3 (or interference immunity) without compromising NF when necessary. This performance 'enhancement' is accomplished by varying the gain of the first active element in the receiver. The gain can be varied by varying the gain of the LNA over a continuous range or switching out the low noise amplifier with bypass switches.

Figure 1:
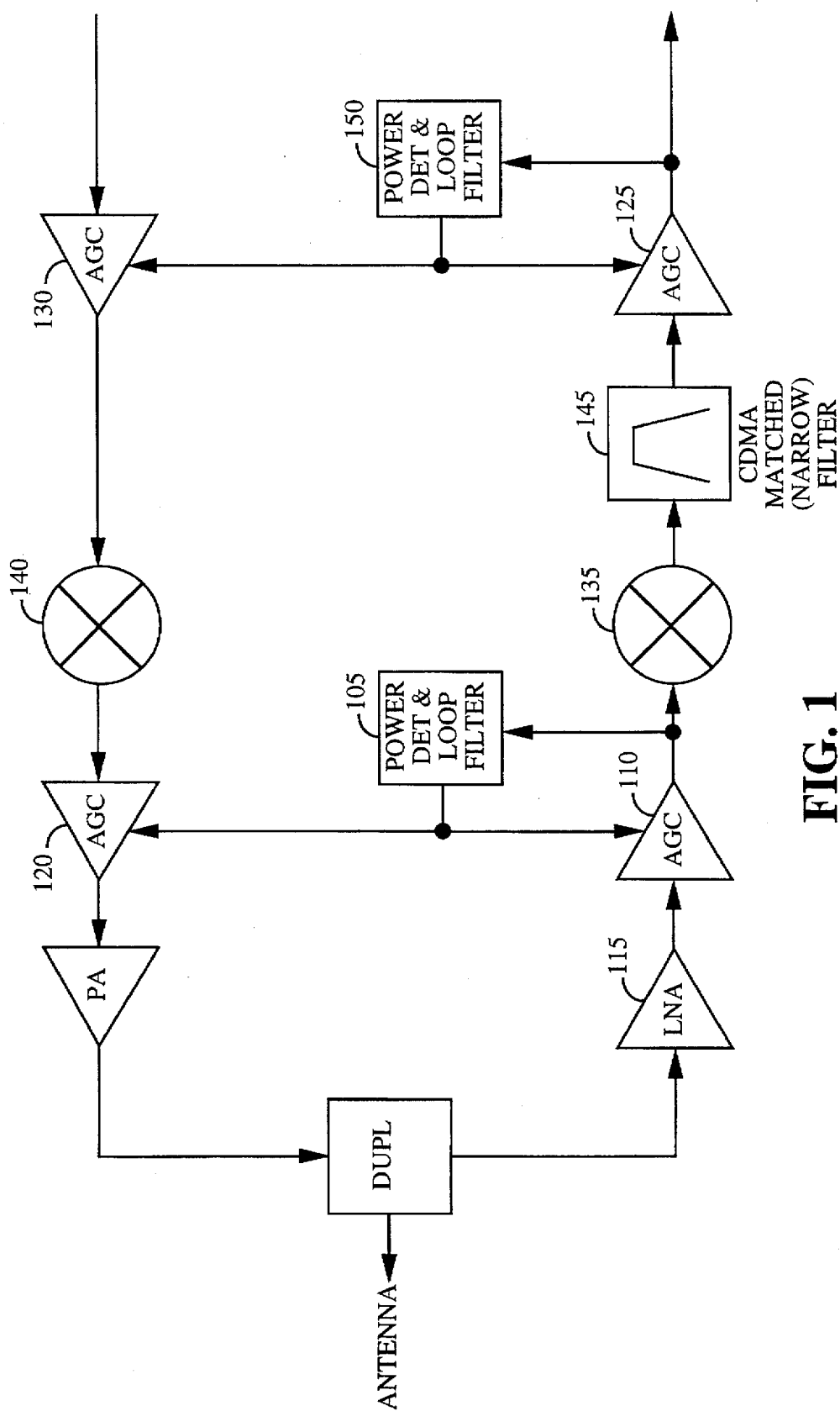
FIG. 1 shows a block diagram of the apparatus of the present invention for increasing receiver immunity.

A block diagram of the preferred embodiment of the present invention is illustrated in FIG. 1. This embodiment involves adjusting the LNA 115 gain on a continuous basis using adjustable gain control (AGC) 110 at the receiver front end. The continuous AGC 110 at the front end also provides a linearity benefit at a minimum RF input level while the AGC 120 on the transmit side may reduce the IF AGC 125 and 130 requirements.

This embodiment detects the power output from the LNA 115. The power detector 105 measures both the signal power and the jammer power together at RF. Using this embodiment, the power detector 105 can continuously decrease the LNA 115 gain at a lower received power than the −65 dBm of the subsequent "switched gain" embodiments of FIGS. 7, 10, 11 and 12.

The preferred embodiment operates by the power detector 105 detecting the received signal and jammer power at RF. This detected power goes through a loop filter and is used to adjust the receive AGC 110, thereby adjusting the intercept point of the receive components. The gain is decreased as the measured power increases and the gain is increased as the measured power decreases. This embodiment could also combine the LNA 115 and the AGC 110 to form a variable gain LNA, thus eliminating the need for the separate AGC 110 block. The power of the transmit AGC 120, located before the power amplifier 150, is adjusted in the same way as the receive AGC 110 in order to maintain the overall TX power level.

AGC amplifiers 125 and 130 are also located after the mixers 135 and 140 in order to adjust the gain after the jammers have been filtered out by the bandpass filter 145. These AGC amplifiers 125 and 130 perform the normal CDMA AGC function of open loop power control, closed loop power control, and compensation. These IF AGCs 125 and 130 are required due to the wide dynamic range requirements for CDMA. Typically, these AGCs 125 and 130 have greater than 80 dB of gain range. The receive and transmit AGC 125 and 130 after the mixers are adjusted by another power detector 150 that measures the total power after the received signal is downconverted. The power detector 150 adjusts the AGCs 125 and 130 gain downward as the downconverted signal's power increases and adjusts the AGCs 125 and 130 gain upward as the downconverted signal's power decreases.

In the preferred embodiment, the received signals are in the frequency band of 869–894 MHz. The transmitted signals are in the frequency band of 824–849 MHz. Alternate embodiments use different frequencies.

Figure 5:
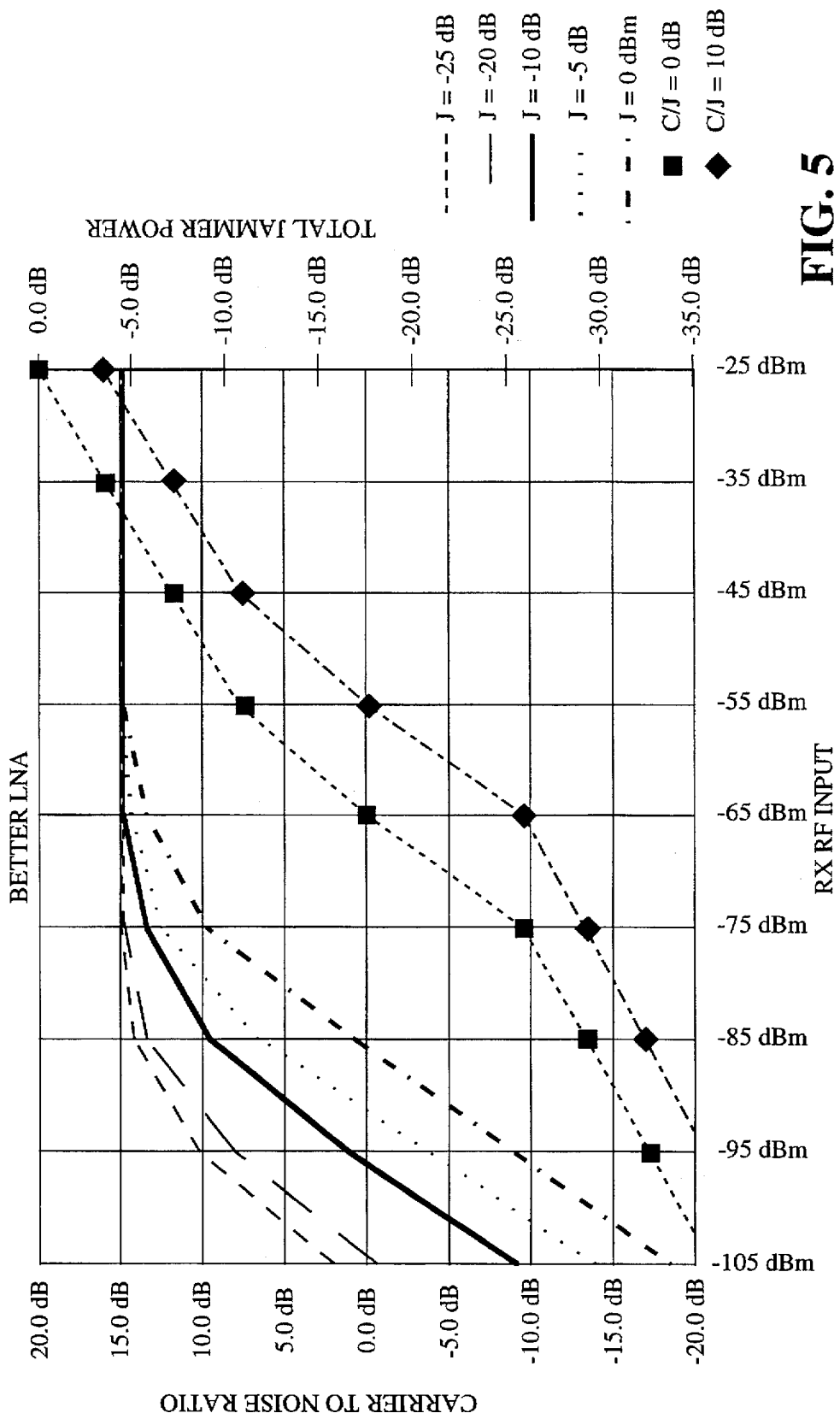
FIG. 5 shows a another plot of received RF input power versus carrier to noise ratio in accordance with the embodiment of FIG. 7.

The plot illustrated in FIG. 5 shows the benefit of this AGC approach. The left hand y-axis shows the carrier over noise ratio versus receive input power parameterized by the jammer level. The right hand y-axis shows the total jammer power required for a constant C/J as a function of received input power. When the jammer is not present (−100 dBm), the radio operates as though there is no RF AGC. As the jammer is increased, the C/N is decreased, but the effective linearity is also increased. In this example, the RF dynamic range is 30 dB and the threshold, where the RF AGC becomes active, is at the point the jammer power is greater than −25 dBm.

Figure 2:
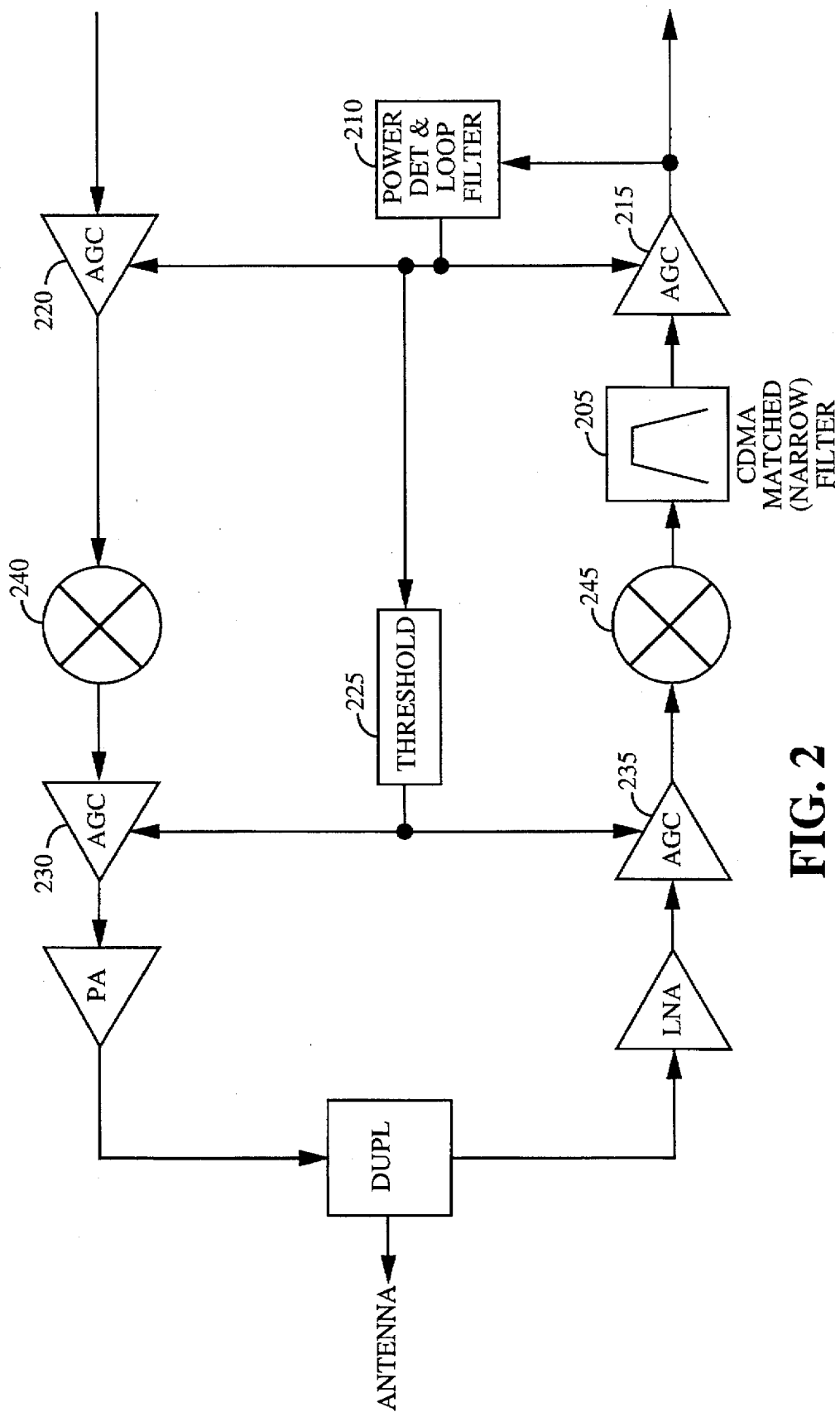
FIG. 2 shows a block diagram of another alternate embodiment of the present invention.

An alternate embodiment of the continuous gain adjustment is illustrated in FIG. 2. This embodiment first filters out the jammers with the bandpass filter 205 before the power detector 210 determines the power level of the downconverted signal. A threshold detector 225 determines when the signal power level reaches a certain point, −105 dBm in this embodiment, and then adjusts the AGCs 230 and 235 gain down when the signal power exceeds that power level. The AGCs 230 and 235 gain is adjusted upward when the signal power level goes below this threshold. The gain of AGCs 215 and 220 after the mixers 240 and 245 is adjusted continuously without checking for a predetermined threshold of power, performing the normal CDMA AGC power control.

Figure 6:
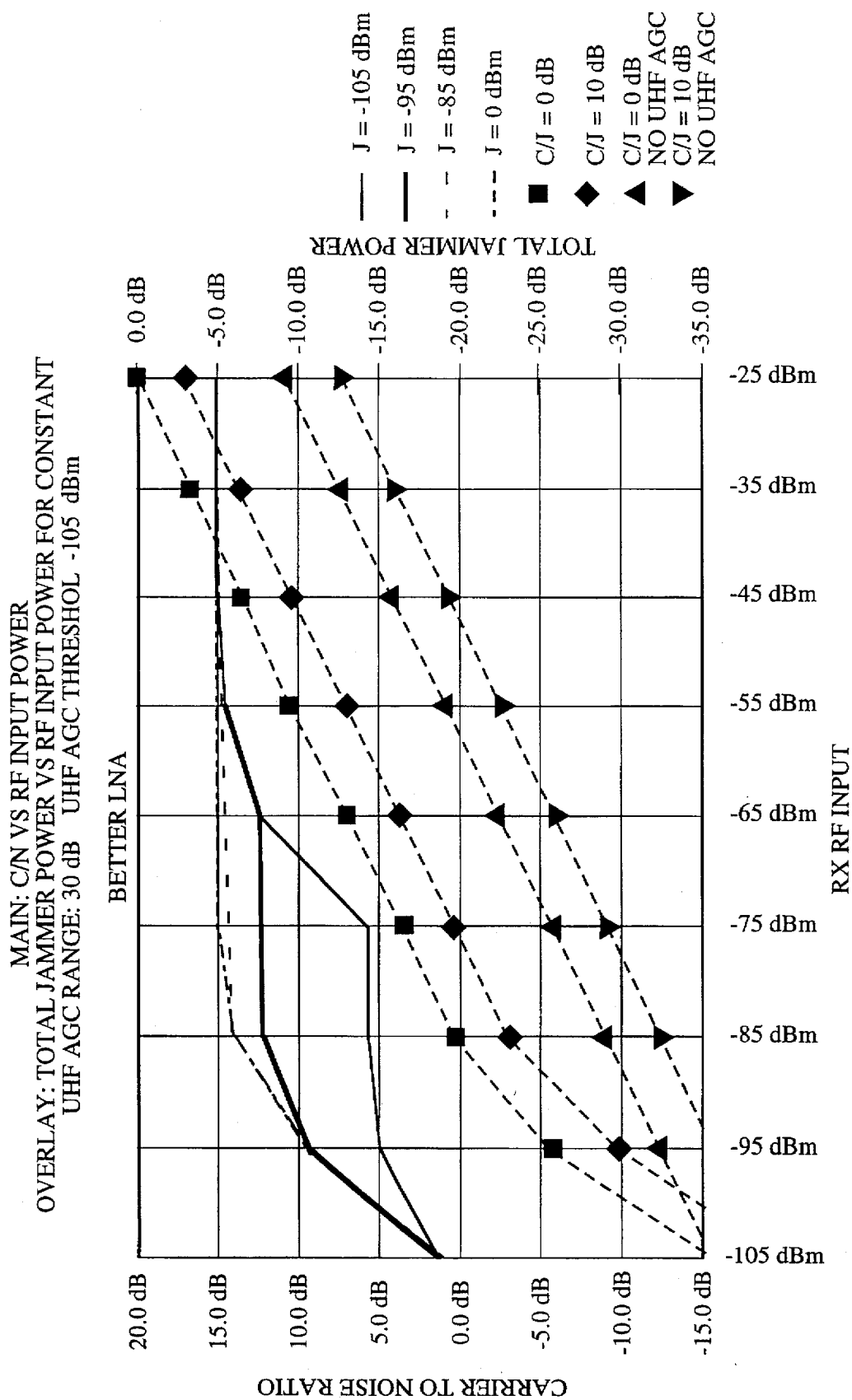
FIG. 6 shows a plot of receive RF input power versus carrier to noise ratio in accordance with the embodiment of FIG. 8.

The plot of this embodiment is illustrated in FIG. 6. When the threshold is set at −105 dBm, the minimum receive RF level, the C/N does not increase as quickly as the case where there is no RF AGC. The advantage of this embodiment is that the linearity benefit begins at a very low RF input power, no receive RF power detector is needed, and the AGC loop detects signal power only. Hence, the AGC loop is a simpler design than detecting at RF power.

Figure 3:
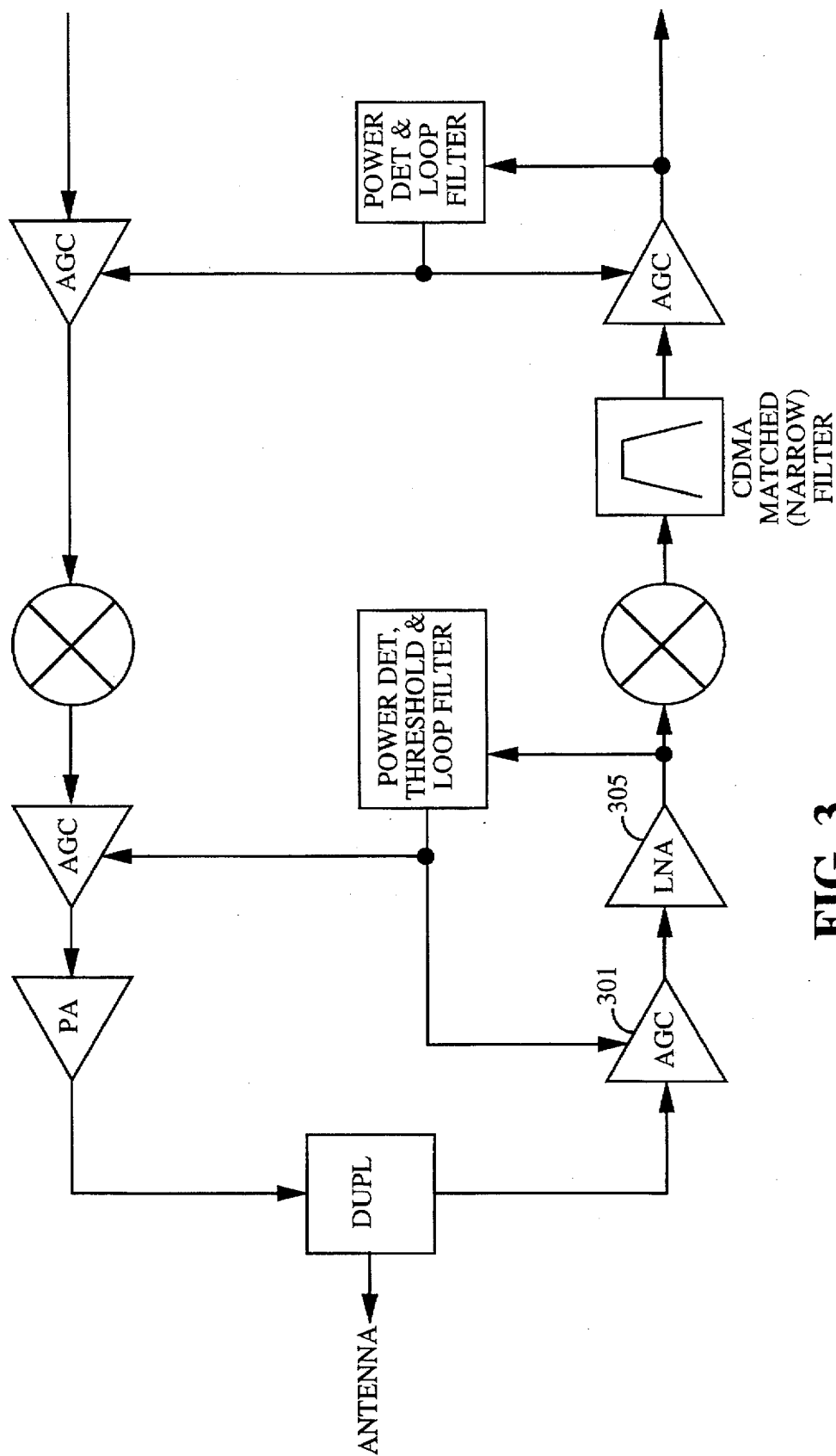
FIG. 3 shows a block diagram of another alternate embodiment of the present invention.

Still another embodiment of the present invention is illustrated in FIG. 3. This embodiment operates similarly to the embodiment of FIG. 1. The only difference being the placement of the AGC 301 prior to the LNA 305 in the receive path.

Figure 4:
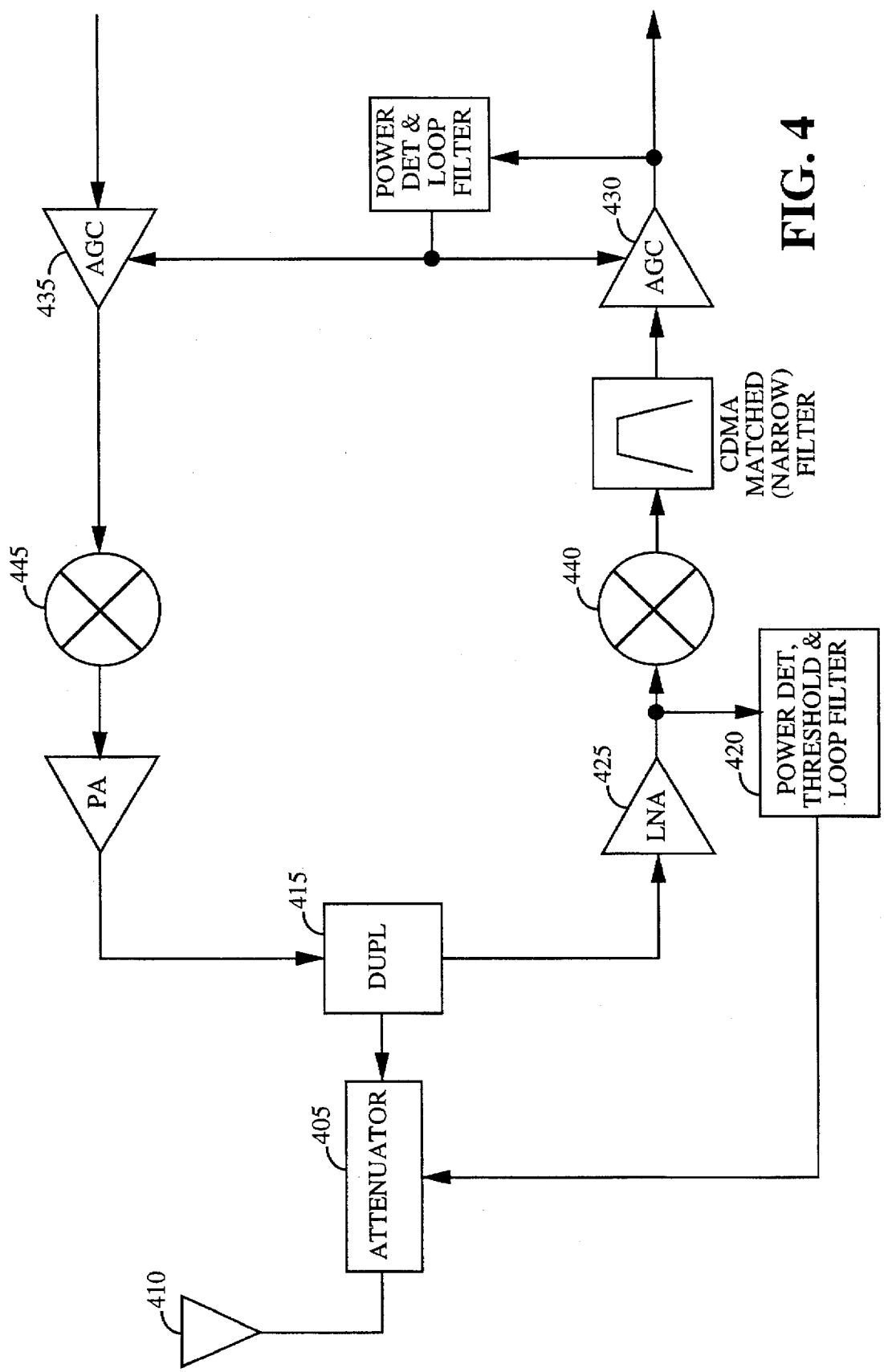
FIG. 4 shows a block diagram of another alternate embodiment of the present invention.

Yet another embodiment of the present invention is illustrated in FIG. 4. This embodiment uses an attenuator 405 between the antenna 410 and the duplexer 415. The attenuation is controlled by the power detector 420 after the LNA 425. The power detector 420 measures the received signal and jammer power, filters it, and compares it to a predetermined threshold. In this embodiment, the threshold is −25 dBm. When the combined signal and jammer power reaches this threshold, the attenuation caused by the attenuator 405 is increased. This adjustment can be either in digital fixed steps or continuously adjusted. The AGC 430 and 435 after the mixers 440 and 445 are adjusted in the same manner as the FIG. 1 preferred embodiment.

Figure 7:
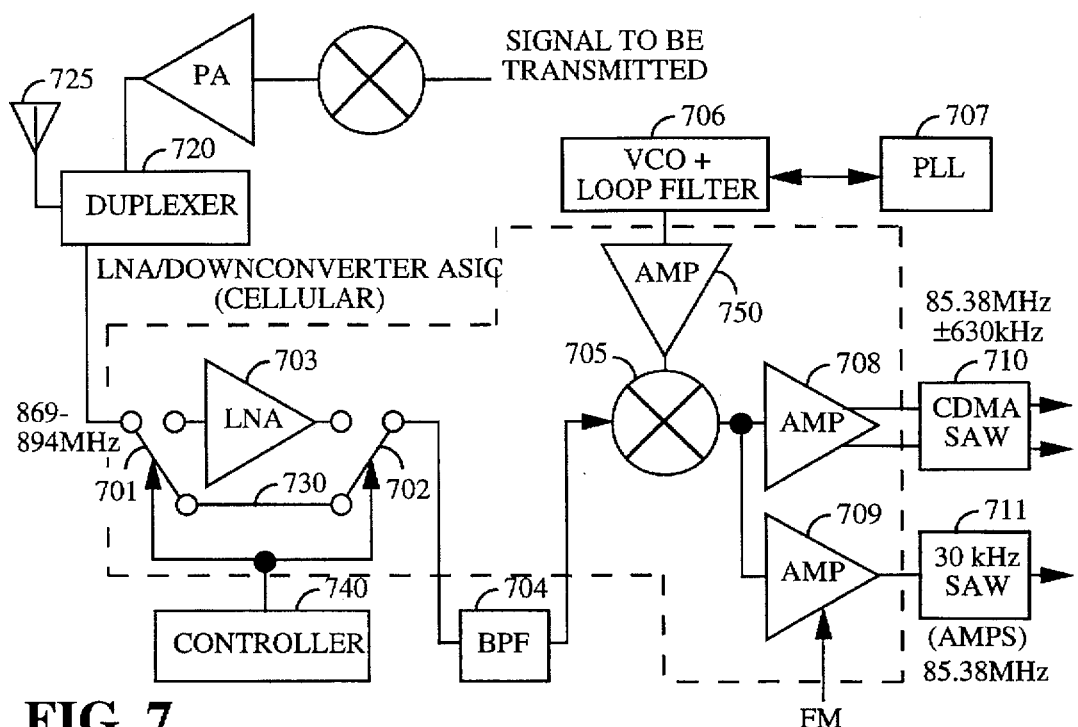
FIG. 7 shows a block diagram of another alternate embodiment of the present invention.

An alternate embodiment of the apparatus of the present invention is illustrated in FIG. 7. This embodiment uses switches 701 and 702 to alter the front end gain. The actual switching level depends on the signal to noise requirements as a function of the signal level, or noise figure, for a particular CDMA radiotelephone design. The present invention can be used in an AMPS radiotelephone, however the switching characteristics will be changed to accommodate a different operating point.

This embodiment is comprised of an antenna 725 that receives and transmits radio signals. Receive and transmit paths in the radio are coupled to the antenna 725 through a duplexer 720 that separates the received signals from the transmitted signals.

A received signal is input to an LNA 703 that is coupled between two switches 701 and 702. One switch 701 couples the LNA 702 to the duplexer 720 and the second switch 702 couples the LNA 703 to a band-pass filter 704. In the preferred embodiment, the switches 701 and 702 are single-pole double-throw gallium arsenide switches.

The LNA 703 is coupled to one pole of each switch such that when both switches 701 and 702 are switched to those poles, the received signal is coupled to the LNA 703 and the amplified signal from the LNA 703 is output to the band-pass filter 704. The band-pass filter 704 in this embodiment has a frequency band of 869–894 MHz. Alternate embodiments use different bands depending on the frequencies of the signals being received.

A bypass path 730 is coupled to the other pole of each switch. When the switches 701 and 702 are switched to their other poles, the received signal from the duplexer 720 bypasses the LNA 703 and is conducted directly to the band-pass filter 704. In this embodiment, these switches 701 and 702 are controlled by the radiotelephone's microcontroller 740. In an alternate embodiment, a separate controller is used to control the positions of these switches.

After the band-pass filter 704 has filtered the received signal, the filtered signal is downconverted to a lower intermediate frequency (IF) for use by the rest of the radio. The down-conversion is done by mixing 705 the received signal with another signal having a frequency set by a phase locked loop 707 driving a voltage controlled oscillator 706. This signal is amplified 750 before being input to the mixer 705.

The downconverted signal from the mixer 705 is input to the back end AGCs 708 and 709. These AGCs 708 and 709 are used by the radiotelephone for closed loop power control, as is already well known in the art.

In the process of the present invention, the microcontroller 740 monitors the power of the received signal. When the power exceeds −65 dBm, the microcontroller 740 instructs the switches 701 and 702 to switch to the bypass position, thus coupling the received signal directly to the bandpass filter 704. By bypassing the LNA 703 gain, the intercept point for the receiver is increased proportionally by the reduction in gain in dB. Alternate embodiments use other circuitry and methods to monitor the power of the received signal.

An alternate embodiment of the process of the present invention continuously adjusts the front end gain. This embodiment uses a lower power threshold such as −25 dBm.

Figure 8:
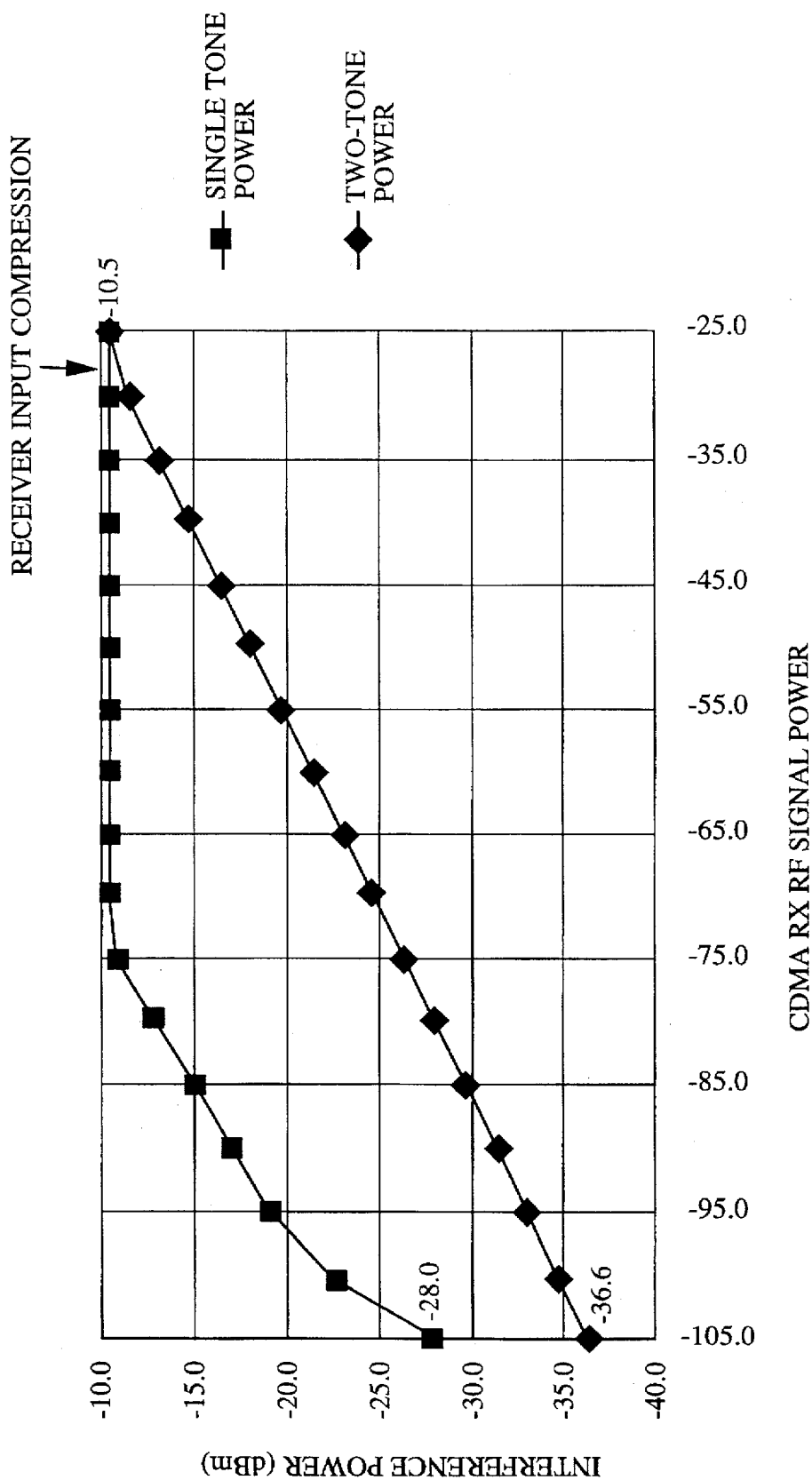
FIG. 8 shows a plot of interference power vs. signal power without using the apparatus of the present invention.
Figure 9:
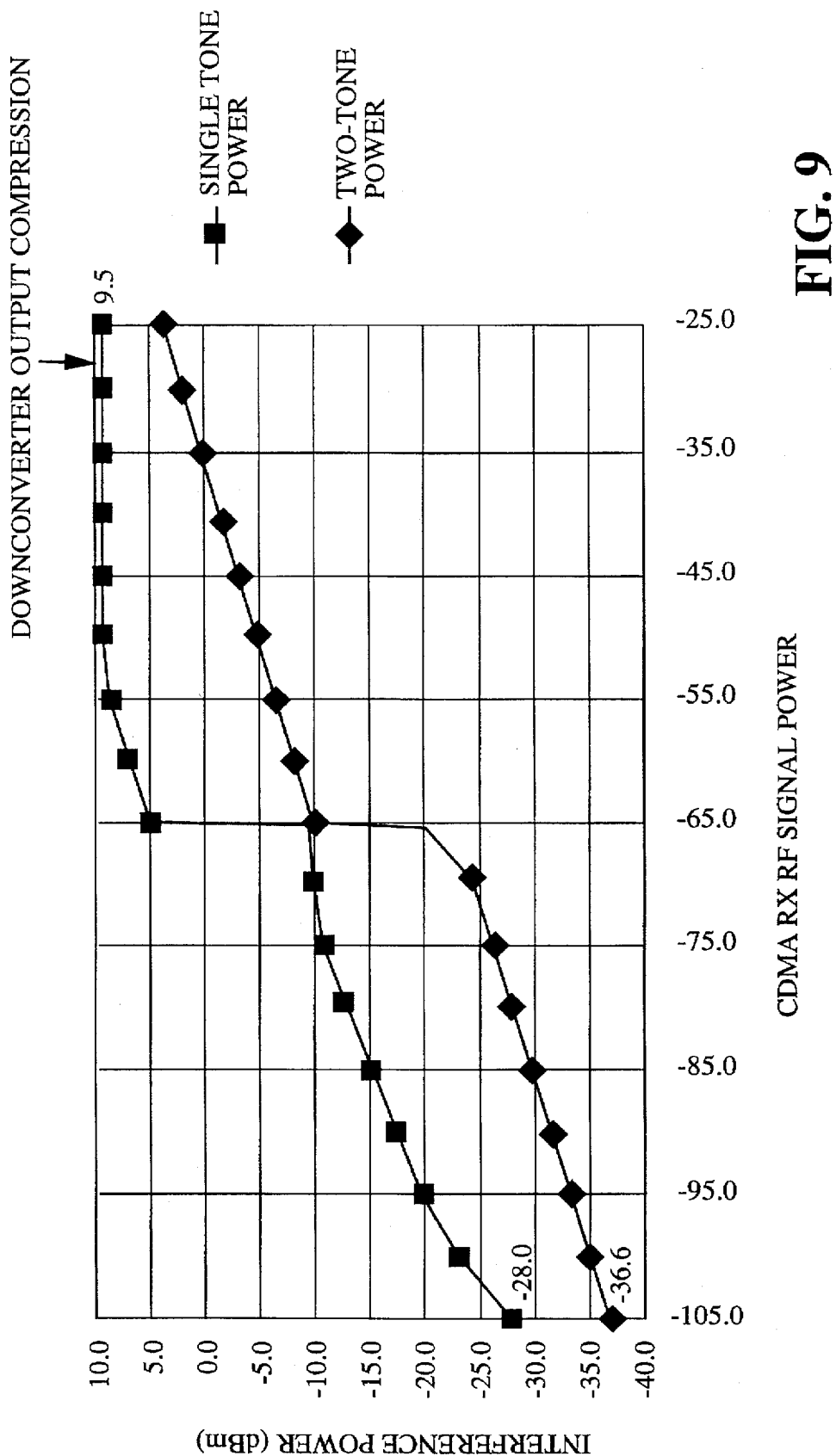
FIG. 9 shows a plot of interference power vs. signal power in accordance with the alternate embodiments of the apparatus of the present invention.

The plots of FIGS. 8 and 9 illustrate the benefits of the switchable gain embodiments of the present invention illustrated in FIGS. 7, 10, 11 and 12. FIG. 8 illustrates a plot of interference power versus radio frequency (RF) signal power for a typical radio that is not using the switchable gain apparatus. This plot shows that the maximum interference level is limited to the receiver input compression point at −10.5 dBm. Both the single and dual tone power curves are shown.

The plot of FIG. 9 shows the interference power received by the radio versus the radio frequency signal power received by the radio using the switchable gain method and apparatus of the present invention. It can be seen that at the −65 dBm point of the graph, the switches are switched to bypass the LNA gain thus allowing a greater interference power to be tolerated without affecting the RF signal power. Both the single tone and two tone power curves are shown.

Figure 10:
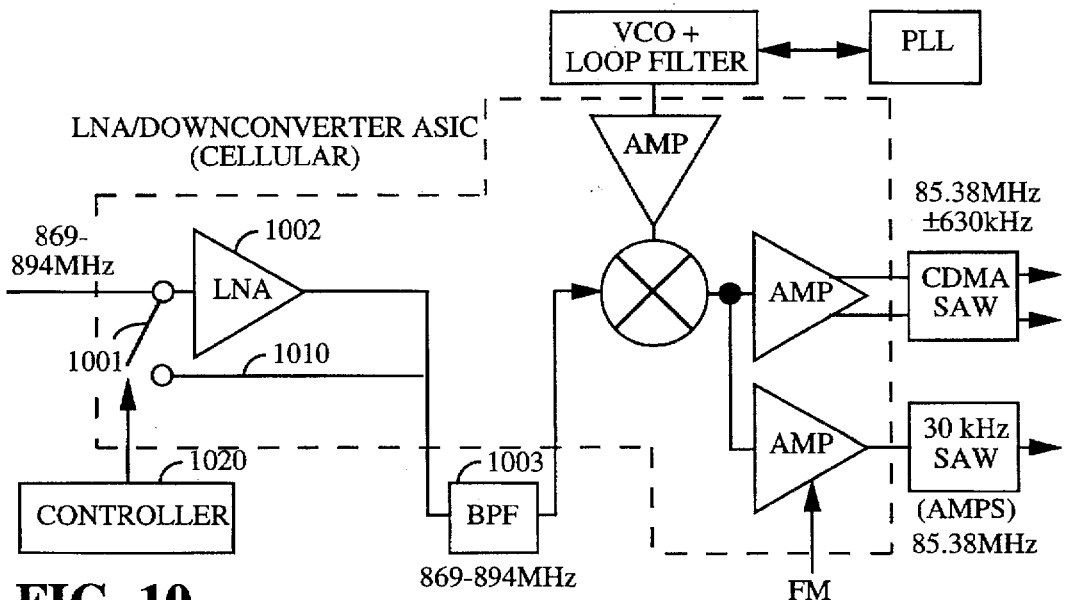
FIG. 10 shows a block diagram of an alternate embodiment of the present invention.

Another alternate embodiment of the apparatus of the present invention is illustrated in FIG. 10. This embodiment uses a single-pole single-throw switch 1001. In this embodiment, the switch 1001 is switched to the bypass path 1010 by the controller 1020 when the received signal power reaches −65 dBm. This effectively shorts out the LNA 1002 gain, thus coupling the received signal directly to the bandpass filter 1003.

Figure 11:
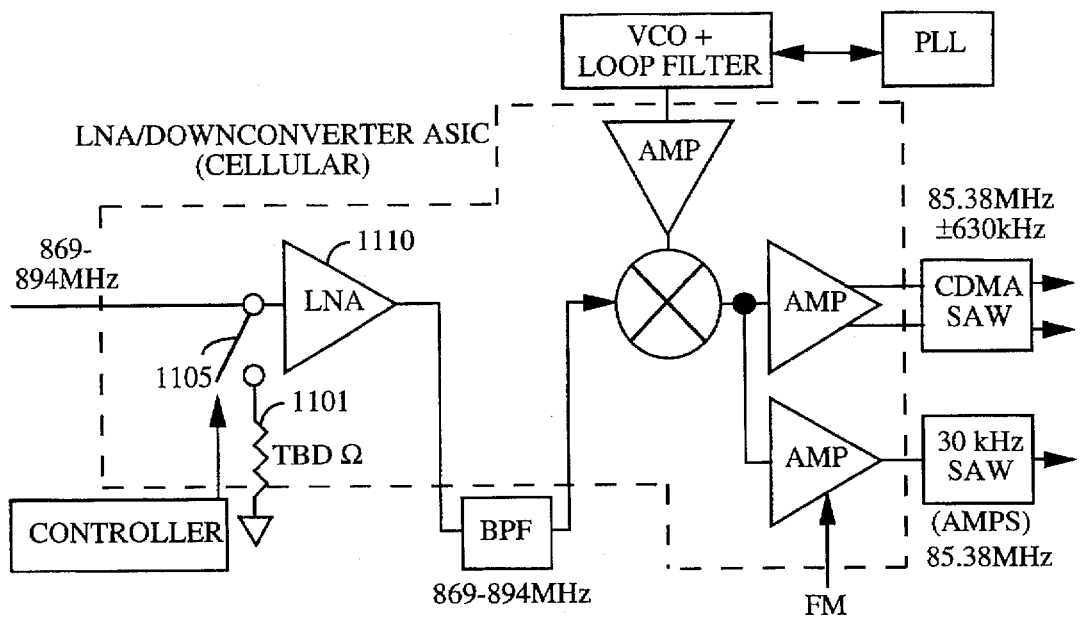
FIG. 11 shows a block diagram of another alternate embodiment of the present invention.

Yet another alternate embodiment of the apparatus of the present invention is illustrated in FIG. 11. This embodiment uses a single-pole single-throw switch 1105 that, when closed, shorts the input of the LNA 1110 to ground through a resistor 1101. This creates an impedance mismatch at the input causing the signal to attenuate, thus reducing the gain caused by the LNA 1110. As in the above embodiments, the switch 1105 is closed when the input signal power reaches −65 dBm. The resistance required for the resistor 1101 is dependent on the amount of attenuation desired. This resistance will be different for different LNA's in alternate embodiments.

Figure 12:
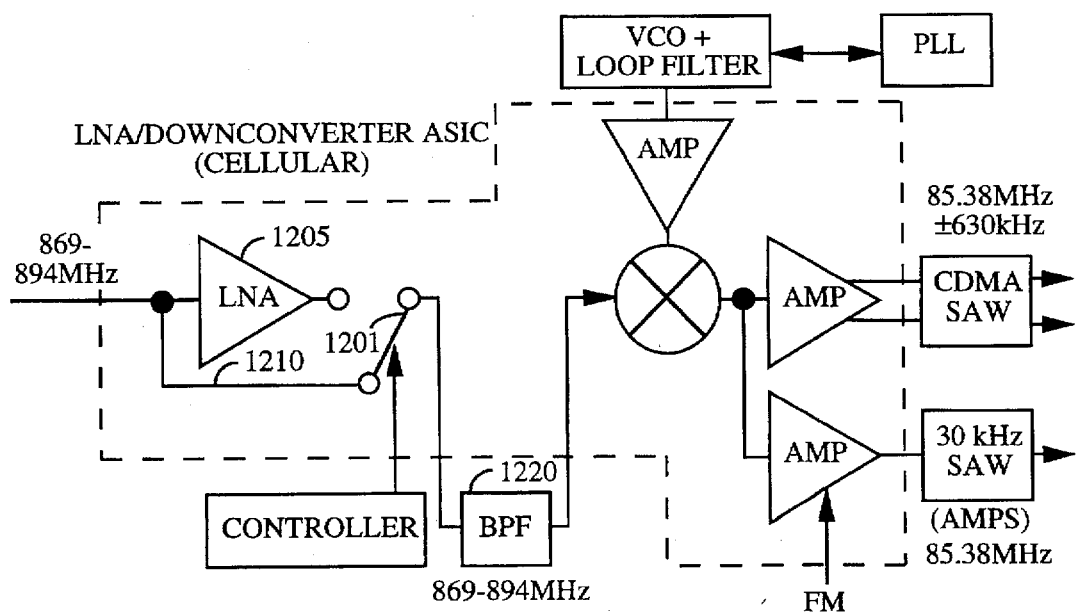
FIG. 12 shows a block diagram of another alternate embodiment of the present invention.

Still another embodiment of the apparatus of the present invention is illustrated in FIG. 12. This embodiment uses a single-pole double-throw switch 1201 at the output of the LNA 1205. The LNA 1205 is connected to one pole of the switch 1201 and a bypass path 1210 is connected to the other pole. The input to the bypass path 1210 is connected to the input of the LNA 1205. When the power level of the received RF signal reaches −65 dBm, the switch 1201 is thrown from the position coupling the LNA 1205 to the bandpass filter 1220 to the bypass path 1210. This couples the signal directly to the band-pass filter 1220, bypassing the gain of the LNA 1205.

In all of the above embodiments, the LNA can be powered down at the same time that it is bypassed by the switch or switches. This can be accomplished by connecting the LNA's power pin to a switch that is also controlled by the controller. Once the LNA is bypassed and is no longer used, power can be removed. This reduces the power consumption of the radio, thus increasing the talk and standby time for which the battery can be used.

In another embodiment of the present invention, $E_c/I_o$ detection is used to determine when to adjust the front end gain. Additional embodiments use other quality measurements, such as $E_b/I_o$.

These ratios are quality measurements for digital communications system performance. The $E_b/I_o$ ratio expresses the energy per bit to the total interference spectral density of the channel while the $E_c/I_o$ ratio expresses the energy per CDMA chip relative to the total interference spectral density. $E_b/I_o$ can be considered a metric that characterizes the performance of one communication system over another; the smaller the required $E_b/I_o$ the more efficient is the system modulation and detection process for a given probability of error. Given that $E_c/I_o$ and received signal strength are readily available, the microcontroller can detect the presence of strong interference as a drop in $E_c/I_o$ while the AGC detector detects the increased interference. The microcontroller can lower the front end gain to improve interference immunity which would improve $E_c/I_o$ and lower the distortion products falling within the signal bandwidth.

When the signal quality goes above the $E_b/I_o$ or $E_c/I_o$ threshold, the front end gain is reduced. The gain adjustment can be accomplished using either the continuous adjustment method or the amplifier switching method, both described above.

Figure 15:
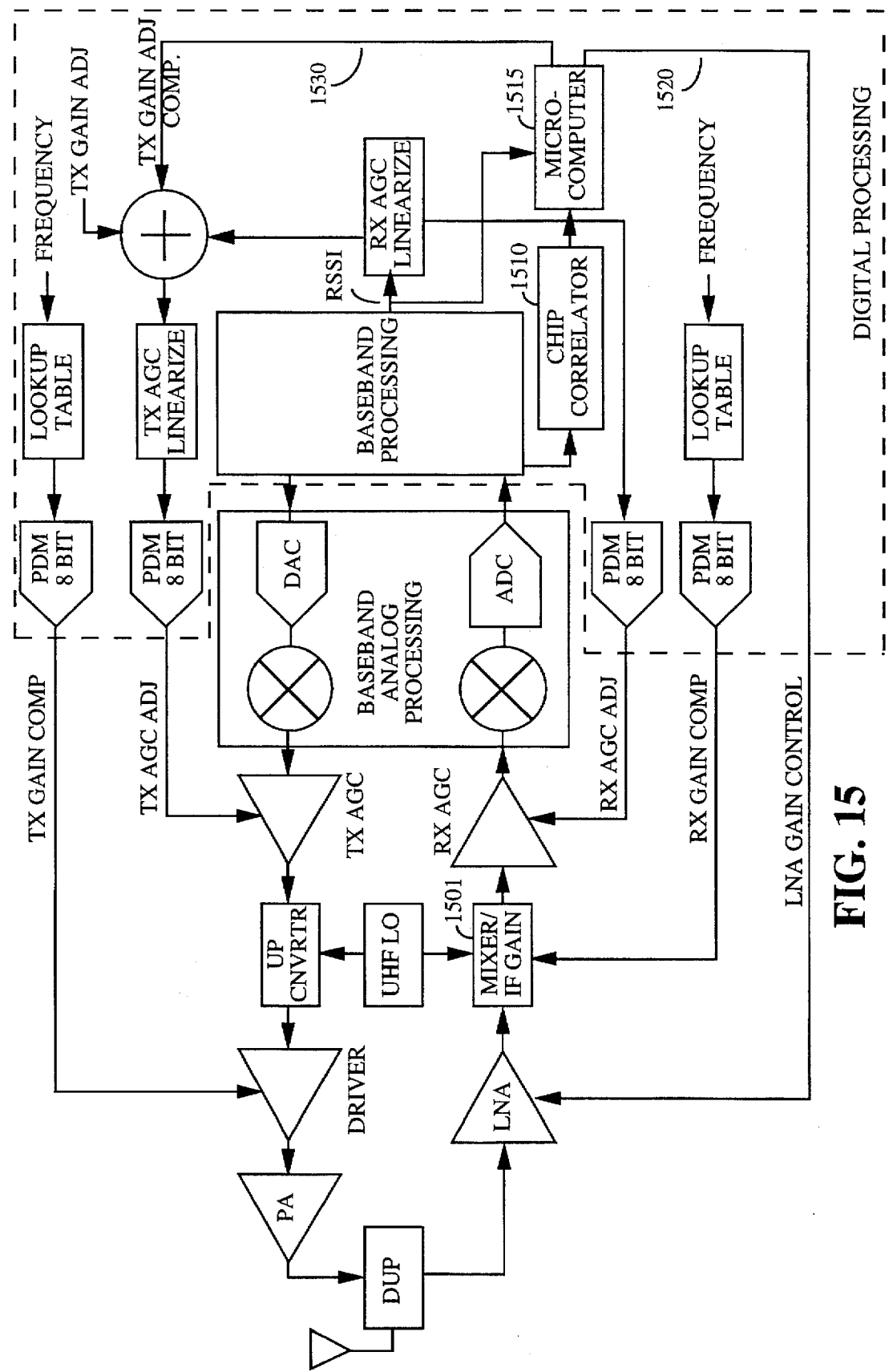
FIG. 15 shows a block diagram of a method for detecting the power of a received signal in accordance with the present invention.

Still another embodiment, illustrated in FIG. 15, would be to detect the signal power at IF or baseband instead of the combination of the signal and jammer power at RF. This approach is simpler in that there is only one power detector and AGC control loop.

FIG. 15 illustrates a block diagram of the alternate method of detecting the power of the received signal. The signal is first downconverted to baseband frequency 1501. This analog signal is then converted to a digital signal 1505 for further baseband processing including determining the received signal strength. The chip correlator 1510 determines the energy per chip with respect to the energy of all the non-coherent components. This information, along with the received signal strength indicator (RSSI) is used by the processor 1515 to determine the amount of gain adjustment for both the receive 1520 and transmit 1530 power.

Since the received signal power measurement includes both the signal and jammer power, the receive gain is increased only when both the signal level and the energy per chip drops. Since the RSSI is being changed, the transmit power must also be changed to compensate, thus enabling the open loop power control to operate properly. Thus, the processor adjusts the transmit gain whenever the receive gain is adjusted.

Other embodiments use erasures or signal power to control the variable gain AGC. Additional embodiments, instead of controlling both transmit and receive power, only control receiver power.

Figure 13:
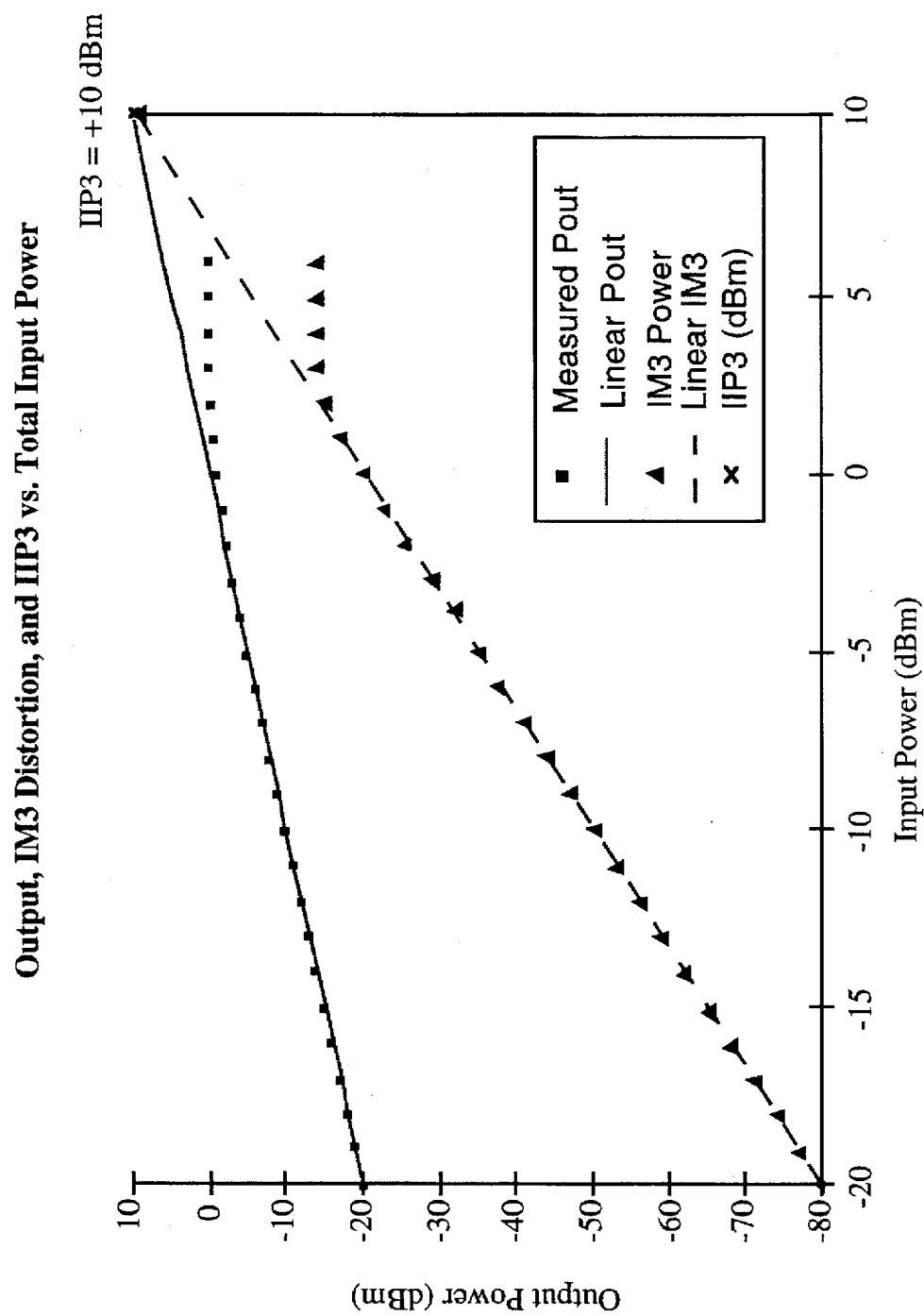
FIG. 13 shows a plot of non-linear transfer characteristics and distortion measurement.
Figure 14:
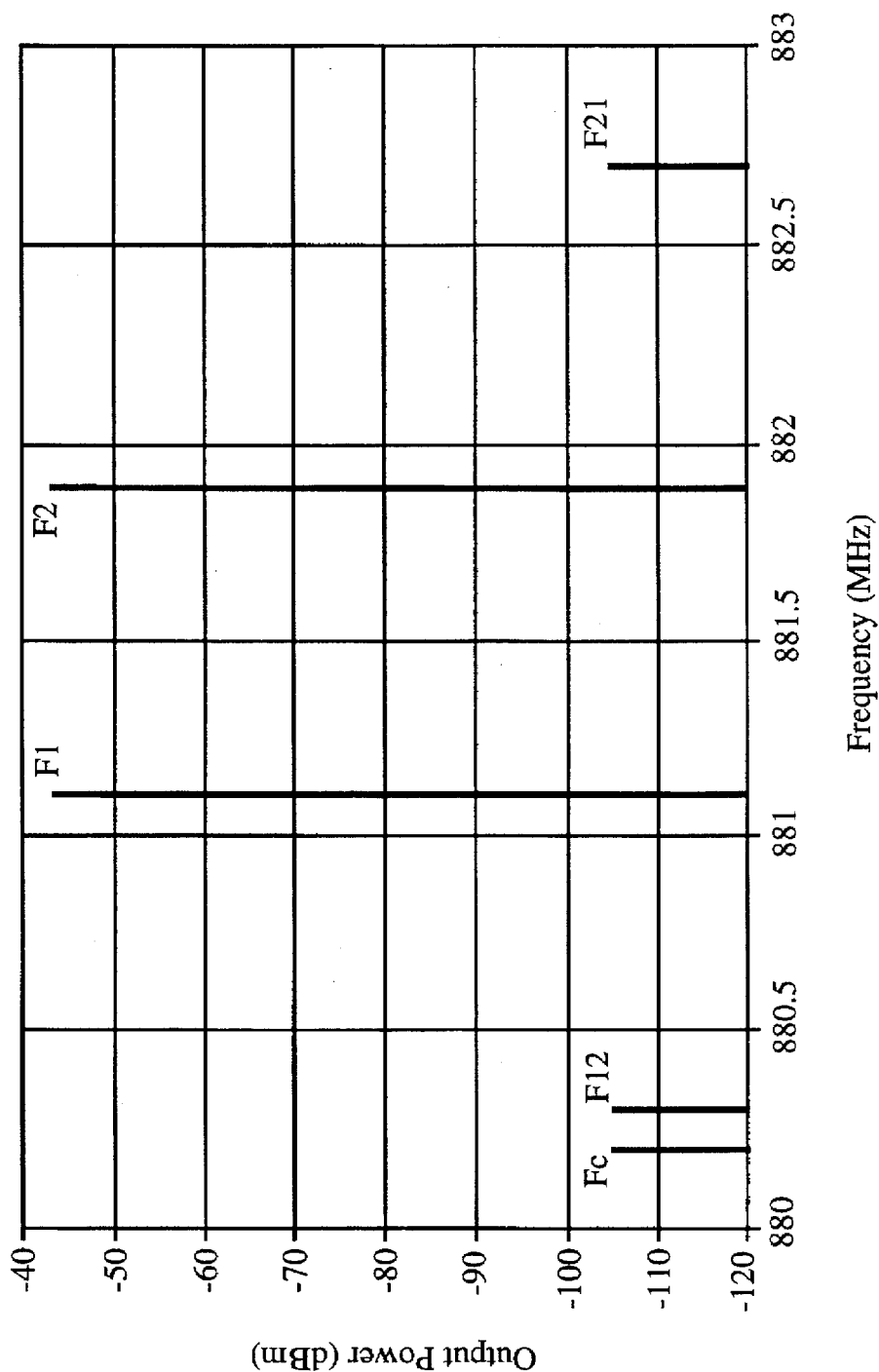
FIG. 14 shows a spectral description of distortion products.
Figure 16:
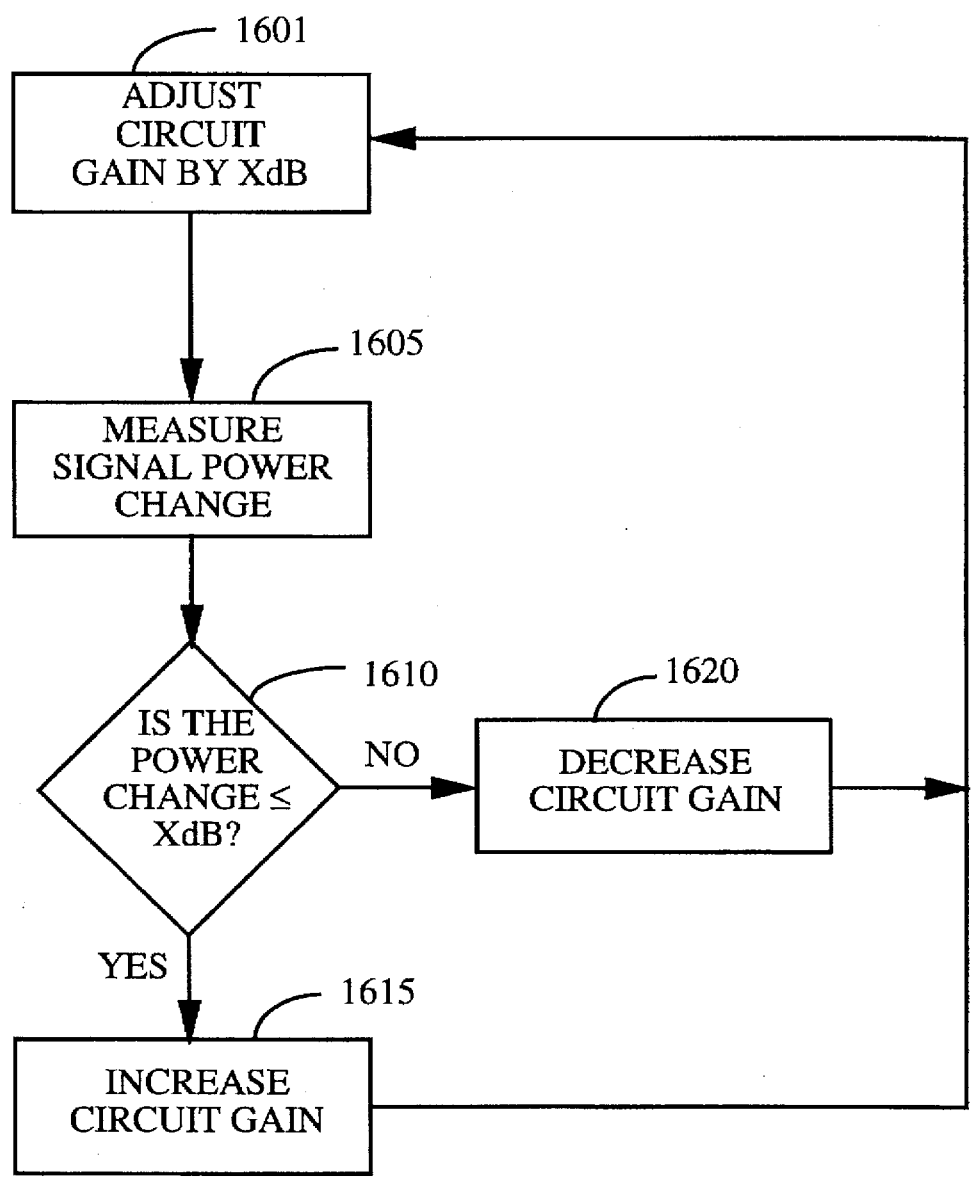
FIG. 16 shows a flow chart of the attenuation control process of the present invention.

A process for controlling the gain of the above embodiments is illustrated in FIG. 16. This process is based on the relationship illustrated in the graph of FIG. 13. In FIG. 13, one can see that as the interference input power increases along the X axis, the intermodulation products (the lower curve) increase faster than the interference power. Therefore, X dB of attenuation applied at the input will result in a decrease of the IM3 intermodulation products by 3*X dB if interference is present at the receiver input.

Typically, intermodulation products don't fall into the IF section of the radio due to their low power. Intermodulation products outside of the IF section oft he radio do not cause receiver performance problems. Thus, adjustment of the receiver gain is only necessary if the intermodulation products are of sufficient power to affect the IF signal.

Referring to FIG. 16, the process of the present invention first adjusts the input gain 1601. In the preferred embodiment, this gain adjustment is 3 dB. However, other embodiments can use other values of gain adjustment, such as the range of 1 dB–6 dB. The receiver processing is then used to measure the change in the power of the received signal 1605. In the preferred embodiment, the automatic gain control processing detects the IF signal power change. It is understood that measurement of the change in received signal power may be accomplished at the RF or baseband stages of the receiver as well.

If the signal power changes by approximately 3 dB, the CDMA signal is greater than the noise floor and there are no intermodulation products that might cause problems. Additional gain adjustment is not needed in this case, but increasing the gain will improve receiver sensitivity. IF signal power changes of approximately (3±0.5) dB are still considered to be 3 dB.

If the IF signal power changes by less than 3 dB 1610, the CDMA signal is less than the noise floor or there are no intermodulation products that might cause problems. In this case, the AGC is only seeing a small CDMA signal and noise. Therefore, it is necessary to increase the receiver circuit gain 1615 and thus increase the sensitivity of the receiver.

If the IF signal power changes by more than 3 dB, the intermodulation products are causing enough of a problem that additional gain adjustment is necessary 1620. In the preferred embodiment, if the input gain was changed by 3 dB the intermodulation products will change by 9 dB when large interference is present. In this case, the average gain may be decreased by a small amount (e.g., 3 dB) until the process of the present invention determines that the intermodulation products are reduced to an acceptable level.

The process of the present invention can be used continuously, checking for intermodulation products at a low rate. This rate is ten times per second in the preferred embodiment. Other embodiments use the process once per frame cycle. Still other embodiments use the process at other rates, such as upon detection of a significant error on the forward link.

In summary, the method of the present invention enables a mobile radio to travel near antennas of different systems while increasing the radio's resistance to radio frequency interference from the other system. By decreasing the front end gain, the intercept point of the radio's receive circuitry increases so that the spurs from the other system's signals will not cause performance degradation of the receiver and demodulator.

I claim:

1. A method for circuit gain adjustment, the circuit having a signal with power, the method comprising the steps of:
    varying the circuit gain a predetermined amount;
    determining a magnitude of a change in the power of the signal in response to the varying of the circuit gain; and
    adjusting the circuit gain in response to the magnitude of the change in the power of the signal, the step of adjusting comprising the steps of:
        decreasing the circuit gain when the magnitude of the change in the power of the signal is greater than a predetermined threshold; and
        increasing the circuit gain when the magnitude of the change in the power of the signal is less than or equal to the predetermined threshold.

2. The method of claim 1 wherein the predetermined amount is about 3 dB and the predetermined threshold is about 9 dB.

3. A method for adjusting the power of a received signal having a plurality of frames in a circuit having a variable gain, the method comprising the steps of:
    receiving the received signal at a radio frequency;
    converting the received signal from the radio frequency to an intermediate frequency;
    filtering the received signal;
    varying the gain of the circuit by a predetermined amount;
    determining a magnitude of a change in the power of the received signal in response to varying the gain; and
    adjusting the gain of the circuit in response to the magnitude of the change in the power of the received signal, said step of adjusting comprising the steps of:
        decreasing the gain of the circuit when the magnitude of the change in the power of the received signal is greater than a predetermined threshold; and
        increasing the gain of the circuit when the magnitude of the change in the power of the received signal is less than or equal to the predetermined threshold.

4. The method of claim 3 wherein the predetermined amount is about 3 dB and the predetermined threshold is about 9 dB.

5. The method of claim 3 wherein said step of determining magnitude of a change in the power of the received signal is performed before said step of converting the received signal from the radio frequency to an intermediate frequency.

6. The method of claim 3 wherein said step of determining a magnitude of a change in the power of the received signal is performed after said step of converting the received signal from the radio frequency to an intermediate frequency.

7. The method of claim 3 wherein said step of determining a magnitude of a change in the power of the received signal is performed after said step of filtering the received signal.

8. The method of claim 3 further comprising the step of repeating said varying, determining, and adjusting steps at a predetermined rate.

9. The method of claim 8 wherein said predetermined rate is about 10 times per second.

10. The method of claim 8 wherein said predetermined rate is once per frame.

11. A method for increasing immunity of a radiotelephone to radio frequency interference, said radiotelephone having an antenna for receiving radio signals having a received power level, an attenuator, a variable gain receive amplifier, a gain controller, and a receive power detector, the method comprising the steps of:
    said gain controller varying said received power level of said received radio signals by a predetermined amount;
    said receive power detector detecting a magnitude of a change in said received power level of said received radio signals in response to said gain controller varying said received power level; and
    said gain controller adjusting a gain of said variable gain receive amplifier in response to said magnitude of said detected received power level change, said adjusting comprising the steps of:
        said gain controller decreasing said gain of said variable gain receive amplifier when said detected received power level change is greater than a predetermined threshold; and
        said gain controller increasing said gain of said variable gain receive amplifier when said detected received power level change is less than or equal to a predetermined threshold.

12. The method of claim 11 wherein said varying step comprises attenuating said received radio signals with said variable attenuator.

13. The method of claim 11 wherein said varying step comprises adjusting said gain of said variable gain receive amplifier.

14. A system for adjusting the power of a received signal having a plurality of frames in a circuit having a variable gain, the system comprising:

means for receiving the received signal at a radio frequency;

means for converting the received signal from the radio frequency to an intermediate frequency;

means for filtering the received signal;

means for varying the gain of the circuit by a predetermined amount;

means for determining a magnitude of a change in the power of the received signal in response to the varied gain; and means for adjusting the gain of the circuit in response to the magnitude of the change in the power of the received signal, the means for adjusting including:

means for decreasing the gain of the circuit when the magnitude of the change in the power of the received signal is greater than a predetermined threshold; and means for increasing the gain of the circuit when the magnitude of the change in the power of the received signal is less than or equal to the predetermined threshold.

15. The system of claim 14, wherein the predetermined amount is about 3 dB and the predetermined threshold is about 9 dB.

16. The system of claim 14, wherein the means for determining a magnitude of a change in the power of the received signal determines the magnitude of the change before the means for converting converts the received signal from the radio frequency to an intermediate frequency.

17. The system of claim 14, wherein the means for determining a magnitude of a change in the power of the received signal determines the magnitude of the change after the means for converting converts the received signal from the radio frequency to an intermediate frequency.

18. The system of claim 14, wherein the means for determining a magnitude of a change in the power of the received signal determines the magnitude of the change after the means for filtering filters the received signal.

19. An apparatus for increasing immunity of a radiotelephone to radio frequency interference, comprising:

an antenna for receiving radio signals;

a variable gain receive amplifier for amplifying said received signals;

a gain controller for varying a received power level of said received signals by a predetermined amount by adjusting a gain of said variable gain receive amplifier; and a receive power detector for detecting a magnitude of a change in said received power level of said received signals in response to said gain adjustment;

wherein said gain controller adjusts said gain of said variable gain receive amplifier in response to said magnitude of said change in said received power level, said gain controller decreasing said gain of said variable gain receive amplifier when said change in said received power level is greater than a predetermined threshold, and said gain controller increasing said gain of said variable gain receive amplifier when said change in said received power level is less than or equal to said predetermined threshold.

20. An apparatus for increasing immunity of a radiotelephone to radio frequency interference, comprising:

an antenna for receiving radio signals;

a variable attenuator for attenuating said received signals;

a gain controller for varying a received power level of said received signals by a predetermined amount by adjusting an attenuation of said variable attenuator; and a receive power detector for detecting a magnitude of a change in said received power level of said received signals in response to said attenuation adjustment, wherein said gain controller adjusts said attenuation of said variable attenuator in response to said magnitude of said change in said received power level, said gain controller increasing said attenuation of said variable attenuator when said change in said received power level is greater than a predetermined threshold, and said gain controller decreasing said attenuation of said variable attenuator when said change in said received power level is less than or equal to said predetermined threshold.

* * * * *